(12) United States Patent
Wei

(10) Patent No.: US 11,870,014 B2
(45) Date of Patent: Jan. 9, 2024

(54) ENCAPSULATED FLUORESCENT ADHESIVE LAYER HAVING A QUANTUM DOT MATERIAL

(71) Applicant: TCL CHINA STAR OPTOELECTRONICS TECHNOLOGY CO., LTD., Shenzhen (CN)

(72) Inventor: Hongquan Wei, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 860 days.

(21) Appl. No.: 16/757,390

(22) PCT Filed: Mar. 24, 2020

(86) PCT No.: PCT/CN2020/080844
§ 371 (c)(1),
(2) Date: Apr. 18, 2020

(87) PCT Pub. No.: WO2021/168954
PCT Pub. Date: Sep. 2, 2021

(65) Prior Publication Data
US 2022/0310885 A1 Sep. 29, 2022

(30) Foreign Application Priority Data
Feb. 28, 2020 (CN) .......................... 202010128800.7

(51) Int. Cl.
*H01L 33/50* (2010.01)
*C09J 11/04* (2006.01)
(Continued)

(52) U.S. Cl.
CPC ............. *H01L 33/501* (2013.01); *C09J 11/04* (2013.01); *C09J 11/06* (2013.01); *C09J 133/08* (2013.01);
(Continued)

(58) Field of Classification Search
CPC ........ H01L 33/501; H01L 33/54; C09J 11/04; C09J 11/06; C09J 133/08; C09J 163/00; C09J 183/04
See application file for complete search history.

(56) References Cited

U.S. PATENT DOCUMENTS

| | | | |
|---|---|---|---|
| 2006/0244358 A1* | 11/2006 | Kim .................... | C09K 11/883 313/486 |
| 2014/0049155 A1* | 2/2014 | Kurtin .................. | H01L 33/504 977/932 |

(Continued)

FOREIGN PATENT DOCUMENTS

| | | |
|---|---|---|
| CN | 105374922 A | 3/2016 |
| CN | 105679921 A | 6/2016 |

(Continued)

*Primary Examiner* — Alonzo Chambliss
(74) *Attorney, Agent, or Firm* — PV IP PC; Wei Te Chung; Zhigang Ma

(57) ABSTRACT

The present disclosure provides an encapsulated fluorescent adhesive layer, a method for manufacturing the same, and a quantum dot backlight. The quantum dot backlight includes a substrate, a light emitting chip, and the encapsulated fluorescent adhesive layer. The encapsulated fluorescent adhesive layer is used for heat transfer and heat dissipation.

10 Claims, 1 Drawing Sheet

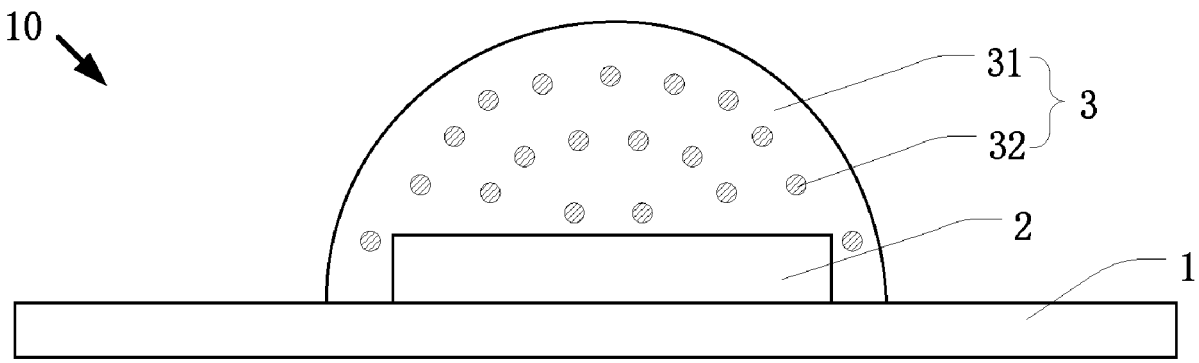

(51) Int. Cl.
*C09J 11/06* (2006.01)
*C09J 133/08* (2006.01)
*C09J 163/00* (2006.01)
*C09J 183/04* (2006.01)
*H01L 33/54* (2010.01)

(52) U.S. Cl.
CPC ........... *C09J 163/00* (2013.01); *C09J 183/04* (2013.01); *H01L 33/54* (2013.01)

(56) References Cited

U.S. PATENT DOCUMENTS

2015/0053914 A1* 2/2015 Kurtin .................. H01L 33/502
257/14
2017/0250332 A1 8/2017 Paulos

FOREIGN PATENT DOCUMENTS

| | | | |
|---|---|---|---|
| CN | 106189249 | A | 12/2016 |
| CN | 108579787 | A | 9/2018 |
| TW | 201409774 | A | 3/2014 |

\* cited by examiner

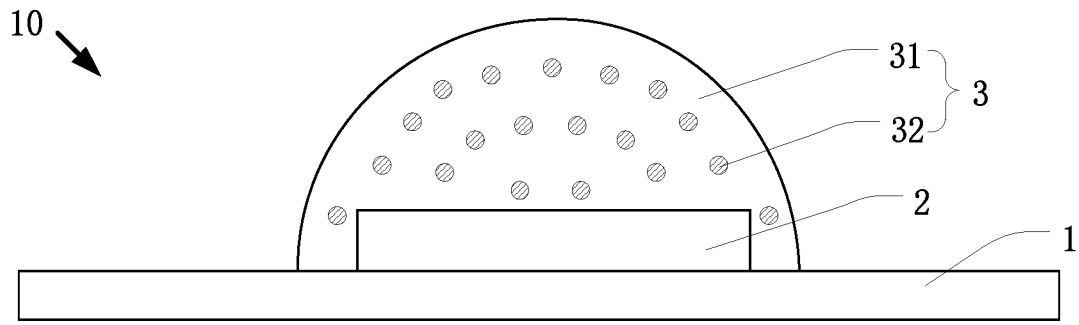

FIG. 1

```
┌─────────────────────────────────────────────────────────┐
│ Mixing encapsulant, melamine, and cyanuric acid in a    │
│ certain proportion, and then dissolving in a            │─── S1
│ tetrahydrofuran solvent or a toluene solvent to form    │
│ a mixed solution                                        │
└─────────────────────────────────────────────────────────┘
                              │
                              ▼
┌─────────────────────────────────────────────────────────┐
│ Adding quantum dot material to the mixed solution,      │
│ stirring and dispersing uniformly, and then removing    │─── S2
│ a solution thereof to obtain a fluorescent colloid      │
│ material                                                │
└─────────────────────────────────────────────────────────┘
                              │
                              ▼
┌─────────────────────────────────────────────────────────┐
│ Coating the fluorescent colloid material on a light     │
│ emitting chip, and then heating and curing to           │
│ polymerize the fluorescent colloid material into a film │─── S3
│ to form the encapsulated fluorescent adhesive layer     │
└─────────────────────────────────────────────────────────┘
```

FIG. 2

ENCAPSULATED FLUORESCENT ADHESIVE LAYER HAVING A QUANTUM DOT MATERIAL

FIELD OF INVENTION

The present disclosure relates to the field of display technologies, and particularly relates to an encapsulated fluorescent adhesive layer, a method for manufacturing the encapsulated fluorescent adhesive layer, and a quantum dot backlight.

BACKGROUND OF INVENTION

Quantum dot material (QD) refers to a semiconductor crystal grain with a particle diameter radius of 1-100 nm. An energy level of a quantum dot changes according to a size of the quantum dot, so a band gap can be controlled by changing the size of the quantum dot. That is, the quantum dot can control an emission wavelength by changing its size. Quantum dots can be used in optoelectronic devices because of their advantages. For example, quantum dots have high color purity, self-emission characteristics, and color adjustability that can be easily adjusted by size adjustment. Therefore, quantum dots have become one of the most noticeable light emitting devices at present.

In recent years, white light emitting diodes (LEDs) based on semiconductor nanocrystals-quantum dots (QDs) have attracted widespread attention from researchers and the industry due to their high luminous efficiency, excellent color rendering performance, and flexible spectral control properties. However, quantum dots emit light along with photo-induced heat generation. Due to lack of effective thermal management measures, conventional quantum dot white light emitting diodes cannot easily dissipate heat through a packaging gel with extremely low thermal conductivity, which eventually leads to increase in device temperature and leads the quantum dot luminescence decaying or even quenching.

Present thermally conductive enhancement materials such as graphene, metal sheets, and the like have serious light absorption and cannot be used to solve problem of photo-induced heating generation in quantum dot white light emitting diodes.

TECHNICAL PROBLEMS

The present disclosure aims to provide an encapsulated fluorescent adhesive layer, a method for manufacturing the encapsulated fluorescent adhesive layer, and a quantum dot backlight to solve the problem of photo-induced heat generation in a quantum dot white light emitting diode in the prior art.

TECHNICAL SOLUTIONS

In order to achieve the above object, the present disclosure provides an encapsulated fluorescent adhesive layer including a modified sealant material and a quantum dot material; the modified sealant material includes encapsulant, melamine, and cyanuric acid; wherein the melamine and the cyanuric acid are complexed to form a stable hexagonal structure for heat transfer and heat dissipation.

Furthermore, a chemical structural formula of the hexagonal structure complexed by the melamine and the cyanuric acid is

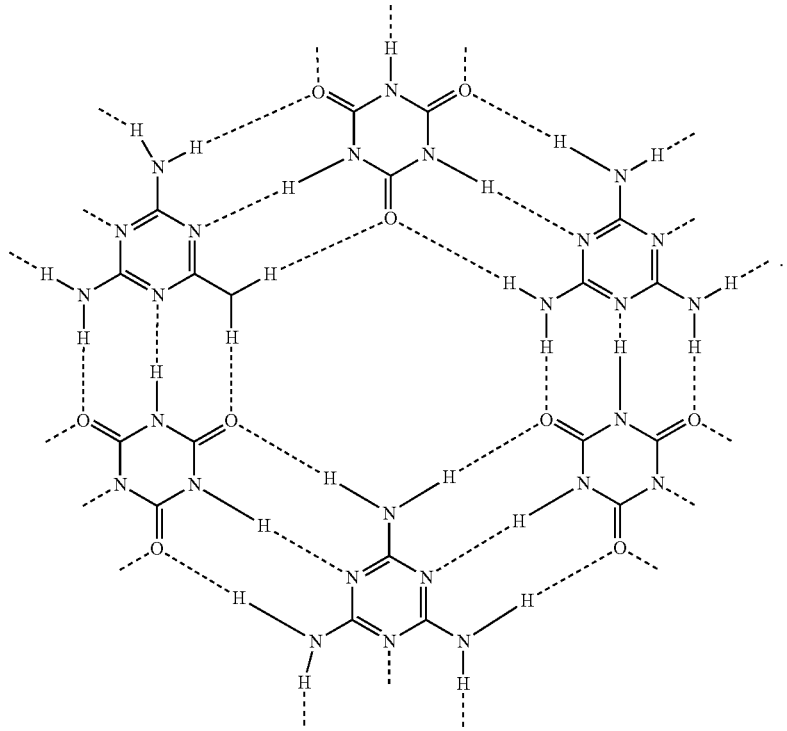

Furthermore, a thermal conductivity of the encapsulated fluorescent adhesive layer ranges between 1 W/(m·K) and 2 W/(m·K).

Furthermore, material of the encapsulant comprises one or more combinations of silicone resin, epoxy resin, and acrylic resin.

Furthermore, a mass percentage of the encapsulant ranges between 50 wt % and 90 wt %, and a common mass percentage of the melamine and the cyanuric acid ranges between 5 wt % and 50 wt %.

Furthermore, a mass percentage of the quantum dot material ranges between 0.1 wt % and 5 wt %.

Furthermore, the quantum dot material includes a green quantum dot material and/or a red quantum dot material.

The present disclosure also provides a method for manufacturing an encapsulated fluorescent adhesive layer, including steps:

mixing encapsulant, melamine, and cyanuric acid in a certain proportion, and then dissolving in a tetrahydrofuran solvent or a toluene solvent to form a mixed solution;

adding a quantum dot material to the mixed solution, stirring and dispersing uniformly, and then removing a solution thereof to obtain a fluorescent colloid material; and coating the fluorescent colloid material on a light emitting chip, and then heating and curing to polymerize the fluorescent colloid material into a film to form the encapsulated fluorescent adhesive layer.

The present disclosure also provides a quantum dot backlight including the encapsulated fluorescent adhesive layer.

Furthermore, the quantum dot backlight further includes a substrate and a light emitting chip disposed on the substrate; the light emitting chip emits blue light; and wherein the encapsulated fluorescent adhesive layer coats the light emitting chip and is configured for heat transfer and heat dissipation.

BENEFICIAL EFFECTS

Beneficial effects of the present disclosure are to provide an encapsulated fluorescent adhesive layer, a method for manufacturing the same, and a quantum dot backlight. Material of the encapsulated fluorescent adhesive layer is modified to form the modified sealant material having the hexagonal structure. The hexagonal structure is a sheet-like mesogenic ordered structure, which can improve the thermal conductivity, form the heat dissipation channel, and increase the thermal conductivity of the encapsulant, thereby effectively improving heat dissipation problem of the white light emitting diode. Furthermore, no filler is needed, and it can ensure ability to isolate water vapor.

DESCRIPTION OF DRAWINGS

FIG. 1 is a schematic view of a quantum dot backlight according to an embodiment of the present disclosure.

FIG. 2 is a flowchart of a method for manufacturing a encapsulated fluorescent adhesive layer according to an embodiment of the present disclosure.

Components in the figures are identified as follows:

1 substrate; 2 light emitting chip; 3 encapsulated fluorescent adhesive layer; 10 quantum dot backlight; 31 modified sealant material; 32 quantum dot material.

DETAILED DESCRIPTION OF EMBODIMENTS

Following descriptions of embodiments are made with reference to additional drawings to illustrate specific embodiments in which the present disclosure can be implemented. Orientational terms mentioned in the present disclosure, such as "up", "down", "front", "rear", "left", "right", "in", "out", "side", etc., are only directions referring to the attached drawings. Therefore, the orientational terms used are for explaining and understanding the present disclosure, but not for limiting the present disclosure. In the figures, similarly structured units are denoted by same reference numerals.

In the drawings, thicknesses of layers and regions are exaggerated for clarity. For example, for ease of description, thicknesses and sizes of elements in the drawings are arbitrarily shown. Therefore, a technical scope described is not limited by the drawings.

In addition, it should be noted that terms "include", "comprise", or any other variation thereof are intended to encompass non-exclusive inclusion, so that a process, a method, an object, or a device including a series of elements includes not only those elements, but also other elements not explicitly listed, or elements inherent to such a process, a method, an object, or a device.

As shown in FIG. 1, a quantum dot backlight 10 is provided in an embodiment of the present disclosure, which includes an encapsulated fluorescent adhesive layer 3.

In the embodiment, the quantum dot backlight 10 further includes a substrate 1 and a light emitting chip 2 disposed on the substrate 1. The light emitting chip 2 emits blue light. Wherein, the encapsulated fluorescent adhesive layer coats the light emitting chip 2 and is used for heat transfer and heat dissipation.

Referring to FIG. 1, the encapsulated fluorescent adhesive layer 3 includes a modified sealant material 31 and a quantum dot material 32. The modified sealant material 31 includes encapsulant, melamine, and cyanuric acid. The melamine and the cyanuric acid are complexed to form a stable hexagonal structure for heat transfer and heat dissipation.

Specifically, a strong hydrogen bonding can be formed between amino and acid groups of the melamine and the cyanuric acid. Non-covalent assembly between molecules follows thermodynamic minimum at equilibrium, so the melamine and the cyanuric acid are complexed to form a hexagonal structure. After polymer is polymerized, a sheet-like mesogenic ordered structure, that is, a network structure is formed.

A molecular formula of the melamine is $C_3H_6N_6$, and a chemical structural formula of the melamine is

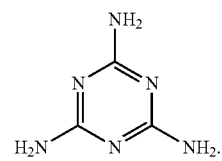

A molecular formula of the cyanuric acid is $C_3H_3N_3O_3$, and a chemical structural formula of the cyanuric acid is

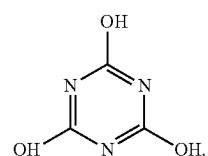

A chemical structural formula of the hexagonal structure complexed by the melamine and cyanuric acid is

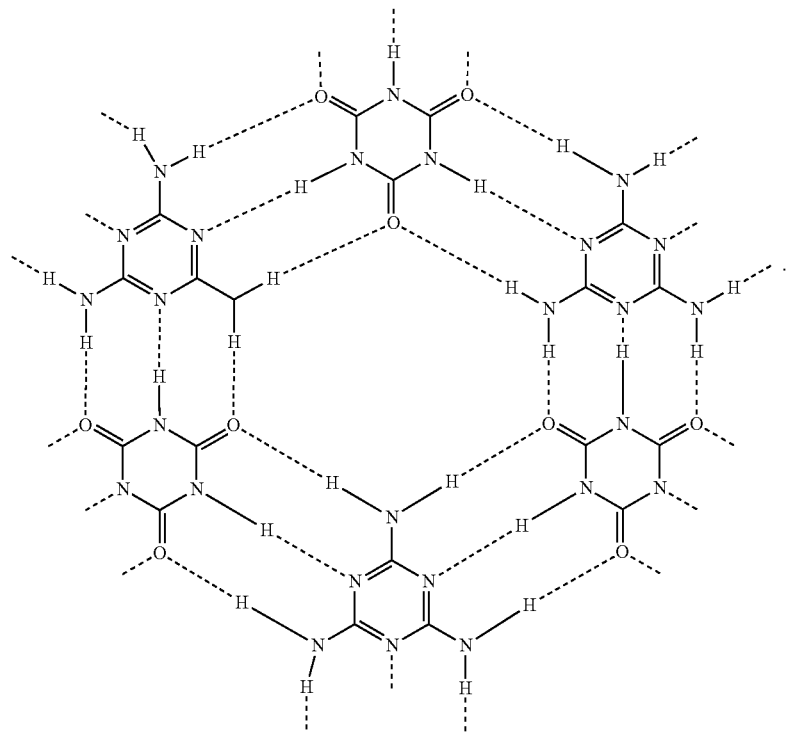

Because the sheet-like stacked mesogenic structure is formed in the polymer colloid, it helps to form a heat dissipation channel, which is an effective and fast channel for heat transfer, thereby improving the problem of poor thermal conductivity of the polymer. Therefore, the hexagonal structure is a sheet-like mesogenic ordered structure, which can improve the thermal conductivity, form the heat dissipation channel, increase the thermal conductivity of the encapsulant, and effectively improve heat dissipation problem of the white light emitting diode. After measurement, the thermal conductivity of the encapsulated fluorescent adhesive layer 3 can be increased from the original epoxy resin 0.2 W/(m·K)-0.3 W/(m·K) to 1 W/(m·K)-2 W/(m·K).

In the embodiment, the modified sealant material 31 having the hexagonal structure is formed through material modification, which effectively improves the thermal conductivity of the encapsulated fluorescent adhesive layer 3, does not require the use of fillers, and can ensure ability to isolate water vapor.

In the embodiment, material of the encapsulant includes one or more combinations of silicone resin, epoxy resin, and acrylic resin. That is, the encapsulant may be an epoxy resin oligomer or an epoxy resin monomer.

In the embodiment, a mass percentage of the encapsulant ranges between 50 wt % and 90 wt %, preferably 60 wt %. A common mass percentage of the melamine and the cyanuric acid ranges between 5 wt % and 50 wt %. Preferably, the melamine and the cyanuric acid are in equal proportions, for a total of 40 wt %.

In the embodiment, a mass percentage of the quantum dot material 32 ranges between 0.1 wt % and 5 wt %, and preferably ranges between 1 wt % and 2 wt %.

In the embodiment, the quantum dot material 32 includes a green quantum dot material and/or a red quantum dot material. Preferably, the quantum dot material 32 is a core-shell structure quantum dot, such as CdSe/ZnS. Preferably, the quantum dot material 32 includes both the green quantum dot material and the red quantum dot material. The green quantum dot material or the red quantum dot material emits light simultaneously under excitation of blue light, thereby obtaining white light.

Referring to FIG. 2, the present disclosure also provides a method for manufacturing the encapsulated fluorescent adhesive layer 3, which includes steps:

S1, mixing encapsulant, melamine, and cyanuric acid in a certain proportion, and then dissolving in a tetrahydrofuran (THF) solvent or a toluene solvent to form a mixed solution;

S2, adding a quantum dot material 32 to the mixed solution, stirring and dispersing uniformly, and then removing a solution thereof to obtain a fluorescent colloid material; and S3, coating the fluorescent colloid material on a light emitting chip 2, and then heating and curing to polymerize the fluorescent colloid material into a film to form an encapsulated fluorescent adhesive layer 3.

Because the sheet-like stacked mesogenic structure is formed in the polymer colloid, it helps to form a heat dissipation channel, which is an effective and fast channel for heat transfer, thereby improving the problem of poor thermal conductivity of the polymer. The encapsulated fluorescent adhesive layer 3 of the embodiment includes a modified sealant material 31, a hexagonal structure of which is a sheet-like mesogenic ordered structure, which can improve the thermal conductivity, form the heat dissipation channel, increase the thermal conductivity of the encapsulant, and effectively improve heat dissipation problem. After measurement, the thermal conductivity of the encapsulated fluorescent adhesive layer 3 can be increased from the original epoxy resin 0.2 W/(m·K)-0.3 W/(m·K) to 1 W/(m·K)-2 W/(m·K).

In the embodiment, the modified sealant material 31 having the hexagonal structure is formed through material modification, which effectively improves the thermal conductivity of the encapsulated fluorescent adhesive layer 3, does not require the use of fillers, and can ensure ability to isolate water vapor.

In the embodiment, material of the encapsulant includes one or more combinations of silicone resin, epoxy resin, and acrylic resin. That is, the encapsulant may be an epoxy resin oligomer or an epoxy resin monomer.

In the embodiment, a mass percentage of the encapsulant ranges between 50 wt % and 90 wt %, preferably 60 wt %. A common mass percentage of the melamine and the cyanuric acid ranges between 5 wt % and 50 wt %. Preferably, the melamine and the cyanuric acid are in equal proportions, for a total of 40 wt %.

In the embodiment, a mass percentage of the quantum dot material 32 ranges between 0.1 wt % and 5 wt %, and preferably ranges between 1 wt % and 2 wt %.

In the embodiment, the quantum dot material 32 includes a green quantum dot material and/or a red quantum dot material. Preferably, the quantum dot material 32 is a core-shell structure quantum dot, such as CdSe/ZnS. Preferably, the quantum dot material 32 includes both the green quantum dot material and the red quantum dot material. The green quantum dot material or the red quantum dot material emits light simultaneously under excitation of blue light, thereby obtaining white light.

The present disclosure also provides a backlight module including the above quantum dot backlight 10. Compared with the prior art, beneficial effects of the backlight module provided by the embodiment of the present disclosure are same as the beneficial effects of the quantum dot backlight 10 provided by the foregoing technical solution, and details are not described herein.

The backlight module is applied to a display device and is used to provide a backlight. The display device may be any product or component having a display function, such as a mobile phone, a tablet computer, a television, a display, a notebook computer, a digital photo frame, or a navigator.

Beneficial effects of the present disclosure are to provide an encapsulated fluorescent adhesive layer, a method for manufacturing the same, and a quantum dot backlight. Material of the encapsulated fluorescent adhesive layer is modified to form the modified sealant material having the hexagonal structure. The hexagonal structure is a sheet-like mesogenic ordered structure, which can improve the thermal conductivity, form the heat dissipation channel, and increase the thermal conductivity of the encapsulant, thereby effectively improving heat dissipation problem of the white light emitting diode. Furthermore, no filler is needed, and it can ensure ability to isolate water vapor.

The above is only a preferred embodiment of the present disclosure. It should be noted that, for those skilled in the art, without departing from principle of the present disclosure, several improvements and retouches can be made. These improvements and retouches should also be regarded as the protection scope of the present disclosure.

What is claimed is:

1. An encapsulated fluorescent adhesive layer, comprising:
   a modified sealant material, comprising encapsulant, melamine, and cyanuric acid; and
   a quantum dot material;
   wherein the melamine and the cyanuric acid are complexed to form a stable hexagonal structure for heat transfer and heat dissipation.

2. The encapsulated fluorescent adhesive layer in claim 1, wherein a chemical structural formula of the hexagonal structure complexed by the melamine and the cyanuric acid is

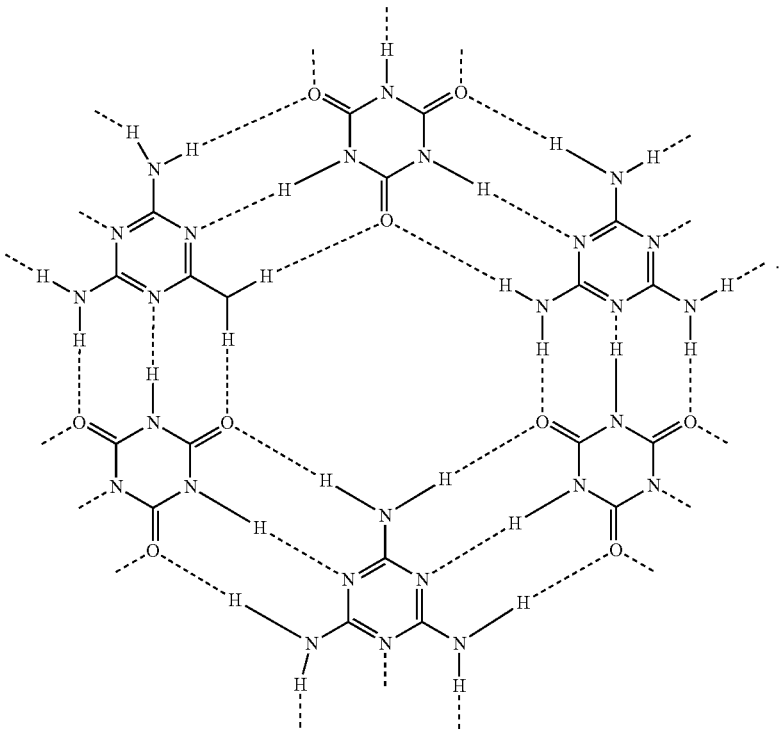

3. The encapsulated fluorescent adhesive layer in claim 1, wherein a thermal conductivity of the encapsulated fluorescent adhesive layer ranges between 1 W/(m·K) and 2 W/(m·K).

4. The encapsulated fluorescent adhesive layer in claim 1, wherein material of the encapsulant comprises one or more combinations of silicone resin, epoxy resin, and acrylic resin.

5. The encapsulated fluorescent adhesive layer in claim 1, wherein a mass percentage of the encapsulant ranges between 50 wt % and 90 wt %, and a common mass percentage of the melamine and the cyanuric acid ranges between 5 wt % and 50 wt %.

6. The encapsulated fluorescent adhesive layer in claim 1, wherein a mass percentage of the quantum dot material ranges between 0.1 wt % and 5 wt %.

7. The encapsulated fluorescent adhesive layer in claim 1, wherein the quantum dot material comprises a green quantum dot material and/or a red quantum dot material.

8. A method for manufacturing an encapsulated fluorescent adhesive layer, comprising following steps:
   mixing encapsulant, melamine, and cyanuric acid in a certain proportion, and then dissolving in a tetrahydrofuran solvent or a toluene solvent to form a mixed solution;
   adding a quantum dot material to the mixed solution, stirring and dispersing uniformly, and then removing a solution thereof to obtain a fluorescent colloid material; and
   coating the fluorescent colloid material on a light emitting chip, and then heating and curing to polymerize the fluorescent colloid material into a film to form the encapsulated fluorescent adhesive layer.

9. A quantum dot backlight, comprising an encapsulated fluorescent adhesive layer, the encapsulated fluorescent adhesive layer comprising:
   modified sealant material, comprising encapsulant, melamine, and cyanuric acid; and
   quantum dot material;
   wherein the melamine and the cyanuric acid are complexed to form a stable hexagonal structure for heat transfer and heat dissipation.

10. The quantum dot backlight in claim 9, further comprising:
   a substrate; and
   a light emitting chip disposed on the substrate; wherein the light emitting chip emits blue light; and
   wherein the encapsulated fluorescent adhesive layer coats the light emitting chip and is configured for heat transfer and heat dissipation.

* * * * *